(12) United States Patent
Li et al.

(10) Patent No.: US 6,657,284 B1
(45) Date of Patent: Dec. 2, 2003

(54) GRADED DIELECTRIC LAYER AND METHOD FOR FABRICATION THEREOF

(75) Inventors: Lain-Jong Li, Hualien (TW);
Shwang-Ming Jeng, Hsin-Chiu (TW);
Syun-Ming Jang, Hsin-Chu (TW);
Chen-Hua Yu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 114 days.

(21) Appl. No.: 09/727,634

(22) Filed: Dec. 1, 2000

(51) Int. Cl.⁷ ............................................... H01L 23/58
(52) U.S. Cl. ....................... 257/649; 257/632
(58) Field of Search ................. 257/639, 636, 257/646, 649, 632

(56) References Cited

U.S. PATENT DOCUMENTS

| | | | |
|---|---|---|---|
| 4,902,584 A | * | 2/1990 | Uchiyama et al. |
| 4,992,306 A | | 2/1991 | Hochberg et al. |
| 5,144,391 A | * | 9/1992 | Iwata et al. |
| 6,072,227 A | * | 6/2000 | Yau et al. |
| 6,080,529 A | | 6/2000 | Ye et al. |
| 6,100,559 A | * | 8/2000 | Park |
| 6,136,654 A | * | 10/2000 | Kraft et al. |
| 6,306,758 B1 | * | 10/2001 | Park |

* cited by examiner

Primary Examiner—Sheila V. Clark
(74) Attorney, Agent, or Firm—Tung & Associates

(57) ABSTRACT

Within a method for forming a dielectric layer, there is first provided a substrate. There is then formed over the substrate a dielectric layer, wherein the dielectric layer is formed from a dielectric material comprising silicon, carbon and nitrogen. Preferably, a nitrogen content is graded within a thickness of the dielectric layer to provide an upper lying nitrogen rich contiguous surface layer of the dielectric layer and a lower lying nitrogen poor contiguous layer of the dielectric layer. The method contemplates a microelectronic fabrication having formed therein a dielectric layer formed in accord with the method. The method provides the resulting dielectric layer with a lower dielectric constant and enhanced adhesion properties as a substrate layer.

8 Claims, 2 Drawing Sheets

GRADED DIELECTRIC LAYER AND METHOD FOR FABRICATION THEREOF

BACKGROUND OF THE INVENTION

1. Field of the Invention

The present invention relates generally to methods for forming dielectric layers within microelectronic fabrications.

More particularly, the present invention relates to methods for forming graded dielectric layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials having dielectric constants in a range of from about 2.0 to about 4.0. For comparison purposes, microelectronic dielectric layers formed within microelectronic fabrications from conventional silicon oxide dielectric materials, silicon nitride dielectric materials and silicon oxynitride dielectric materials typically have comparatively high dielectric constants in a range of from about 4.0 to about 8.0.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers formed of dielectric materials having comparatively low dielectric constants provide microelectronic fabrications which may theoretically operate at higher microelectronic fabrication speeds, with attenuated patterned microelectronic conductor layer parasitic capacitance and attenuated patterned microelectronic conductor layer cross-talk.

Of the comparatively low dielectric constant dielectric materials which may be employed for forming microelectronic dielectric layers within microelectronic fabrications, carbon doped silicon containing dielectric materials, such as carbon doped silicon oxide dielectric materials, are presently of interest. Carbon doped silicon containing dielectric materials, such as carbon doped silicon oxide dielectric materials, are presently of considerable interest insofar as carbon doped silicon containing dielectric materials may be formed employing chemical vapor deposition (CVD) methods and plasma enhanced chemical vapor deposition (PECVD) methods as are generally otherwise conventional in the art of microelectronic fabrication, but with appropriate modification of source materials and/or deposition parameters such as to provide when forming a microelectronic dielectric layer within a microelectronic fabrication a carbon doped silicon containing dielectric material rather than a conventional silicon containing dielectric material.

While carbon doped silicon containing dielectric materials, such as carbon doped silicon oxide dielectric materials, are thus desirable in the art of microelectronic fabrication for forming microelectronic dielectric layers within microelectronic fabrications, carbon doped silicon containing dielectric materials are in turn nonetheless also not entirely without problems in the art of microelectronic fabrication for forming microelectronic dielectric layers within microelectronic fabrications. In that regard, it has been observed in the art of microelectronic fabrication that carbon doped silicon containing dielectric materials when employed for forming microelectronic dielectric layers within microelectronic fabrication often provide substrate surfaces upon which it is difficult to adhere additional microelectronic layers formed within a microelectronic fabrication.

It is thus desirable in the art of microelectronic fabrication to provide microelectronic dielectric layers formed of carbon doped silicon containing dielectric materials, such as carbon doped silicon oxide dielectric materials, having comparatively low dielectric constants, while also providing the microelectronic dielectric layers with enhanced adhesion as substrate layers upon which may be formed additional layers within a microelectronic fabrication.

It is towards the foregoing object that the present invention is directed.

Various methods and materials have been disclosed in the art of microelectronic fabrication for forming microelectronic layers, and in particular microelectronic dielectric layers, with desirable properties in the art of microelectronic fabrication.

For example, Hochberg et al., in U.S. Pat. No. 4,992,306, disclose a low pressure chemical vapor deposition (LPCVD) method for forming, at a comparatively low deposition temperature of from about 325 to about 700 degrees centigrade, and with a comparatively high deposition rate, a silicon oxide dielectric layer, a silicon nitride dielectric layer or a silicon oxynitride dielectric layer within a microelectronic fabrication. In order to realize the foregoing object, the low pressure chemical vapor deposition (LPCVD) method employs in conjunction with an oxidant source material a silicon source material comprising a two or greater carbon atom content alkylazidosilane, arylazidosilane or alkylarylazidosilane.

In addition, Yau et al., in U.S. Pat. No. 6,072,227, disclose, in conjunction with a microelectronic structure resulting therefrom, a method for forming, with enhanced barrier properties and with enhanced etch stop properties, a microelectronic dielectric layer formed of a lower dielectric constant dielectric material within a microelectronic fabrication. In order to realize the foregoing object, the method employs when forming the microelectronic dielectric layer a plasma enhanced chemical vapor deposition (PECVD) method employing a silicon source material comprising an organosilane, preferably methylsilane, along with an oxidant source material, preferably nitrous oxide.

Finally, Ye et al., in U.S. Pat. No. 6,080,529, disclose a method for forming within a microelectronic fabrication a patterned mask layer which after being employed as an etch mask for forming a patterned conductor layer from a blanket conductor layer within the microelectronic fabrication may be readily removed from over the patterned conductor layer without leaving a residue. In order to realize the foregoing result, the method employs a multi-layer patterned mask layer formed over a blanket conductor layer which is desired to be patterned to form the patterned conductor layer, wherein the multi-layer patterned mask layer employs formed closer to the blanket conductor layer a patterned first mask layer formed of a high temperature organic material, such as amorphous carbon, in turn having formed thereupon a patterned second mask layer formed of either an inorganic mateiral or a photoimageable high temperature organic material, such as a plasma polymerized methyl silane (PPMS).

Desirable in the art of microelectronic fabrication are additional methods and materials which may be employed for forming within microelectronic fabrications microelectronic dielectric layers formed of carbon doped silicon containing dielectric materials, such as carbon doped silicon oxide dielectric materials, having comparatively low dielectric constants, but also with enhanced adhesion when employed as microelectronic substrate layers upon which may be formed additional layers within a microelectronic fabrication.

It is towards the foregoing object that the present invention is directed.

SUMMARY OF THE INVENTION

A first object of the present invention is to provide a method for forming a carbon doped silicon containing dielectric layer within a microelectronic fabrication.

A second object of the present invention is to provide a method in accord with the first object of the present invention, wherein the carbon doped silicon containing dielectric layer is formed with a comparatively low dielectric constant while simultaneously providing enhanced adhesion as a substrate layer within the microelectronic fabrication.

A third object of the present invention is to provide a method in accord with the first object of the present invention and the second object of the present invention, wherein the method is readily commercially implemented.

In accord with the objects of the present invention, there is provided by the present invention a method for forming a microelectronic dielectric layer within a microelectronic fabrication. To practice the method of the present invention, there is first provided a substrate. There is then formed over the substrate a dielectric layer, where the dielectric layer is formed from a dielectric material comprising silicon, carbon and nitrogen. Further, within the present invention a nitrogen content within the dielectric layer is preferably graded with respect to a thickness of the dielectric layer.

The method of the present invention also contemplates a microelectronic fabrication having formed therein a dielectric layer in accord with the method of the present invention.

The present invention provides a method for forming a carbon doped silicon containing dielectric layer within a microelectronic fabrication, wherein the carbon doped silicon containing dielectric layer is formed with a comparatively low dielectric constant while simultaneously providing enhanced adhesion when employed as a microelectronic substrate layer within the microelectronic fabrication. The present invention realizes the foregoing object by employing when forming a carbon doped silicon containing dielectric layer within a microelectronic fabrication a dielectric material comprising silicon, carbon and nitrogen. Within the context of the present invention, and particularly under circumstances where a nitrogen content within the dielectric layer is graded with respect to a thickness of the dielectric layer, a lower lying nitrogen poor contiguous sub-layer of a carbon doped silicon containing dielectric layer formed in accord with the present invention may be formed with a comparatively low dielectric constant, while an upper lying nitrogen rich contiguous sub-layer of the carbon doped silicon containing dielectric layer formed in accord with the present invention may be formed, albeit with a comparatively higher dielectric constant, with enhanced adhesion as a substrate layer upon which may be formed an additional layer within a microelectronic fabrication.

The method of the present invention is readily commercially implemented. The present invention employs methods and materials as are otherwise generally known within the art of microelectronic fabrication, but employed within the context of specific process limitations and materials limitations to provide the present invention. Since it is thus at least in part a series of process limitations and materials limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for forming a carbon doped silicon containing dielectric layer within a microelectronic fabrication, wherein the carbon doped silicon containing dielectric layer is formed with a comparatively low dielectric constant while simultaneously providing enhanced adhesion when employed as a microelectronic substrate layer within the microelectronic fabrication. The present invention realizes the foregoing object by employing when forming a carbon doped silicon containing dielectric layer a dielectric material comprising silicon, carbon and nitrogen. Within the context of the present invention, and particularly under circumstances where a nitrogen content within the dielectric layer is graded with respect to a thickness of the dielectric layer, a lower lying nitrogen poor contiguous sub-layer of a carbon doped silicon containing dielectric layer formed in accord with the present invention may be formed with a comparatively low dielectric constant, while an upper lying nitrogen rich contiguous sub-layer of the carbon doped silicon containing dielectric layer formed in accord with the present invention may be formed, albeit with a comparatively higher dielectric constant, with enhanced adhesion as a substrate layer upon which may be formed an additional layer within a microelectronic fabrication.

Although the preferred embodiment of the present invention illustrates the present invention most specifically within the context of forming a carbon doped silicon containing dielectric layer having a graded nitrogen content therein for use simultaneously as an etch stop layer and a first dielectric layer within a dual damascene structure within a microelectronic fabrication, the present invention may also be employed for forming carbon doped silicon containing dielectric layers with or without a nitrogen concentration gradient within various structures within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 5, there is shown a series of schematic cross-sectional diagrams illustrating the results of progressive stages in forming, in accord with a preferred embodiment of the present invention, a microelectronic dielectric layer within a dual damascene microelectronic structure within a microelectronic fabrication.

Figure 1:
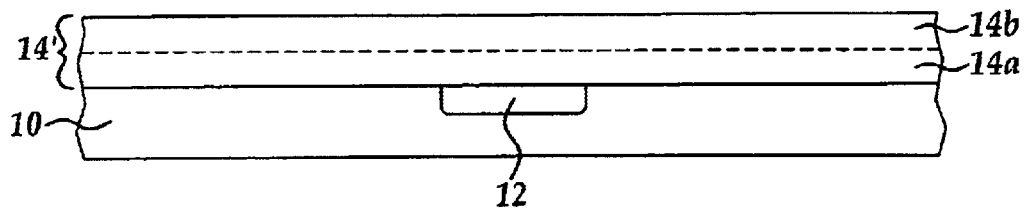
FIG. 1, FIG. 2, FIG. 3, FIG. 4 and FIG. 5 show a series of schematic cross-sectional diagrams illustrating the results of progressive stages of forming, in accord with a preferred embodiment of the present invention, a microelectronic dielectric layer formed within a dual damascene microelectronic structure within a microelectronic fabrication.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiments of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor contact region, particularly under circumstances where the substrate 10 consists of or comprises a semiconductor substrate employed within a semiconductor integrated circuit microelectronic fabrication; or (2) a conductor contact region under circumstances where the substrate 10 is employed within any of the several microelectronic fabrications as noted above.

Shown also within the schematic cross-sectional diagram of FIG. 1 formed upon the substrate 10 having formed therein the contact region 12 is a blanket first graded dielectric layer 14 which in turn comprises a blanket first nitrogen poor contiguous sub-layer 14a formed upon the substrate 10, where the blanket first nitrogen poor contiguous sub-layer 14a in turn has formed thereupon a blanket first nitrogen rich contiguous sub-layer 14b.

Within the preferred embodiment of the present invention, the blanket first graded dielectric layer 14 is formed of a dielectric material comprising silicon, carbon, nitrogen, and preferably, but not necessarily exclusively, also oxygen.

Typically and preferably a nitrogen content within the blanket first graded dielectric layer 14 is localized within the blanket first nitrogen rich contiguous sub-layer 14b and typically and preferably localized within an upper surface layer of the blanket first nitrogen rich contiguous sub-layer 14b, and wherein the nitrogen content is minimally if at all present within the blanket first nitrogen poor contiguous sub-layer 14a. Typically and preferably, the blanket first nitrogen poor contiguous sub-layer 14a is formed to a thickness of from about 100 to about 500 angstroms, the blanket first nitrogen rich contiguous sub-layer 14b is formed to a thickness of from about 100 to about 500 angstroms and the blanket first graded dielectric layer 14 is thus formed to a thickness of from about 200 to about 1000 angstroms.

Within the preferred embodiment of the present invention with respect to the blanket first graded dielectric layer 14, the blanket first graded dielectric layer 14 is typically and preferably formed employing a chemical vapor deposition (CVD) method or a plasma enhanced chemical vapor deposition (PECVD) method employing an organosilane silicon and carbon source material, in conjunction with a nitrogen source material and preferably and optionally also an oxygen source mateiral. Although any of several organosilanes may be employed when forming the blanket first graded dielectric layer 14, including but not limited to alkylorganosilanes, arylorganosilanes and alkylarylorganosilanes as are disclosed within Yau et al, as cited within the Description of the Related Art, the teachings of all of which related art are incorporated herein fully by reference, typically and preferably the organosilane is trimethylsilane, but not an azidosilane. Similarly, although any of several nitrogen source materials may be employed when forming the blanket first graded dielectric layer 14, including but not limited to nitrogen, ammonia and hydrazine, the nitrogen source mateiral is typically and preferably ammonia. Finally, although any of several oxygen source materials may also be employed when forming the blanket first graded dielectric layer 14, including but not limited to oxygen, ozone, nitrous oxide and nitric oxide, typically and preferably, the oxygen source mateiral is nitrous oxide.

Typically and preferably, the blanket first graded dielectric layer 14 is formed employing a plasma enhanced chemical vapor deposition (PECVD) method employing: (1) a reactor chamber pressure of from about 2.5 to about 7 torr; (2) a source radio frequency power of from about 200 to about 1500 watts; (3) a substrate temperature of from about 300 to about 500 degrees centigrade; (4) a trimethylsilane flow rate of from about 50 to about 500 standard cubic centimeters per minute (sccm); (5) an initial nitrous oxide flow rate of from about 50 to about 500 standard cubic centimeters per minute (sccm) which is variably and contiguously decreased to about 50 standard cubic centimeters per minute (sccm); and (6) an initial ammonia in nitrogen carrier gas flow rate of about zero standard cubic centimeters per minute (sccm) which is variably and contiguously increased to about 20 to about 300 standard cubic centimeters per minute (sccm), to thus provide essentially no nitrogen content within the blanket first nitrogen poor contiguous sub-layer 14a and a maximal nitrogen concentration within a surface layer of the blanket first nitrogen rich contiguous sub-layer 14b. Within the context of the above process limitations, the blanket first nitrogen poor contiguous sub-layer 14a will typically and preferably have a silicon:carbon:nitrogen:oxygen atomic ratio and a dielectric constant of from about 3 to about 5, while the blanket fist nitrogen rich contiguous sub-layer 14b will typically and preferably have a silicon:carbon:nitrogen:oxygen atomic ratio and a dielectric constant of from about 4 to about 6.

Figure 2:
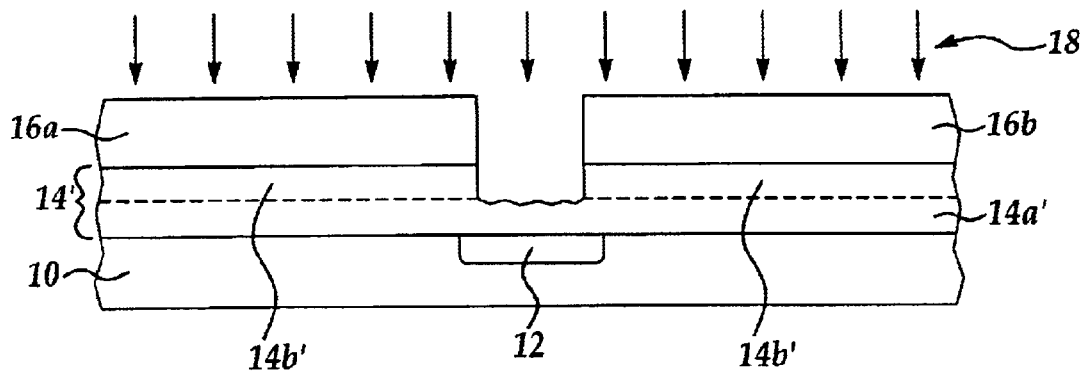

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein in a first instance there is formed upon the blanket first graded dielectric layer 14 a pair of patterned first photoresist layers 16a and 16b.

Within the preferred embodiment of the present invention, the pair of patterned first photoresist layers 16a and 16b may be formed from photoresist materials as are conventional in the art of microelectronic fabrication, including but not limited to photoresist materials selected from the general groups of photoresist materials including but not limited to positive photoresist materials and negative photoresist materials. Typically and preferably, the pair of patterned photoresist layers 16a and 16b is formed to a thickness of from about 5000 to about 15000 angstroms to define an aperture of aperture width from about 0.15 to about 0.25 microns centered above the via region 12 within the substrate 10.

Shown also within the schematic cross-sectional diagram of FIG. 2 is a first etching plasma 18 which is employed for forming from the blanket first graded dielectric layer 14 as illustrated within the schematic cross-sectional diagram of FIG. 1 an etched blanket first graded dielectric layer 14' as illustrated within the schematic cross-sectional diagram of FIG. 2, wherein the etched blanket first graded dielectric layer 14' further comprises a pair of patterned first nitrogen rich contiguous sub-layers 14b' formed upon an etched blanket first nitrogen poor contiguous sub-layer 14a'. Although the preferred embodiment of the present invention as illustrated within the schematic cross-sectional diagram of FIG. 2 illustrates the first etching plasma 18 as being employed for etching only partially through the blanket first graded dielectric layer 14, it is understood by a person skilled in the art that the first etching plasma 18 may alternatively be employed for etching completely through the blanket first graded dielectric layer 14. Significant to the present invention, however, is that the first etching plasma 18 is employed for completely etching through the blanket first nitrogen rich contiguous sub-layer 14b when forming the pair of patterned first nitrogen rich contiguous sub-layers 14b'.

Within the preferred embodiment of the present invention with respect to the first etching plasma 18, the first etching plasma 18 will typically and preferably employ an etchant gas composition which upon plasma activation efficiently etches the blanket first nitrogen rich contiguous sub-layer 14b, while not necessarily etching effectively the blanket first nitrogen poor contiguous sub-layer 14a. Typically and preferably, under circumstances where the blanket first graded dielectric layer 14 is formed employing a trimethylsilane silicon and carbon source material, an ammonia nitrogen source mateiral and a nitrous oxide oxygen source material, the first etching plasma 18 typically and preferably employs an etchant gas composition comprising fluorocarbons, nitrogen, oxygen and argon.

Figure 3:
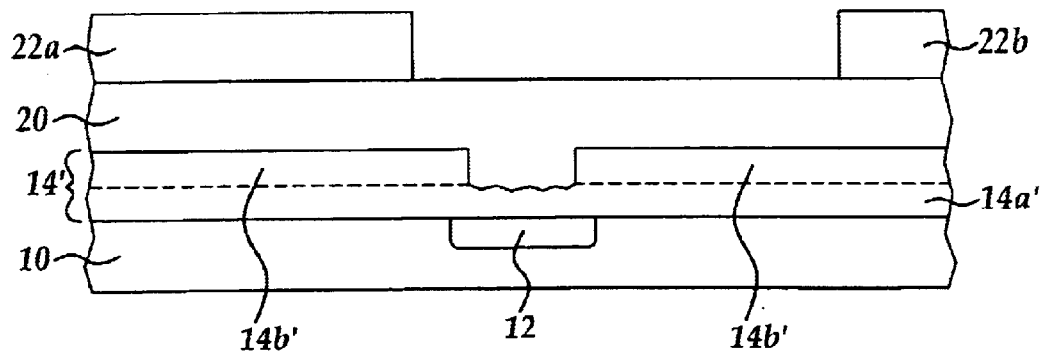

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, the pair of patterned photoresist layers 16a and 16b has been stripped from the microelectronic fabrication.

Within the preferred embodiment of the present invention, the pair of patterned photoresist layers 16a and 16b may be stripped from the microelectronic fabrication whose schematic cross-sectional diagram is illustrated in FIG. 2 to provide in part the microelectronic fabrication whose schematic cross-sectional diagram is illustrated in FIG. 3 while employing photoresist stripping methods as are otherwise conventional in the art of microelectronic fabrication, such photoresist stripping methods being selected from the group including but not limited to wet chemical photoresist stripping methods, dry plasma photoresist stripping methods and aggregate photoresist stripping methods thereof.

Similarly, there is also shown within the schematic cross-sectional diagram of FIG. 3 formed upon the etched blanket first graded dielectric layer 14' a blanket second dielectric layer 20. Within the preferred embodiment of the present invention, the blanket second dielectric layer 20 is typically and preferably formed of a dielectric material analogous or equivalent to the dielectric material from which is formed the blanket first nitrogen poor contiguous sub-layer 14a, in order to typically and preferably provide the blanket second dielectric layer 20 having a dielectric constant of from about 2 to about 4.

Finally, there is also shown within the schematic cross-sectional diagram of FIG. 3 a pair of patterned second photoresist layers 22a and 22b which expose a portion of the blanket second dielectric layer 20 into which is desired to form a trench which overlaps with a via desired to be formed through the etched blanket first dielectric layer 14' and reaching the contact region 12, to ultimately provide a dual damascene structure as is understood by a person skilled in the art.

Within the preferred embodiment of the present invention, the pair of patterned second photoresist layers 22a and 22b is typically and preferably formed employing methods and materials as are analogous or equivalent to the methods and materials which are employed for forming the pair of patterned first photoresist layers 16a and 16b as are illustrated within the schematic cross-sectional diagram of FIG. 2, but wherein the size of an aperture defined by the pair of patterned second photoresist layers 22a and 22b is enlarged.

Figure 4:
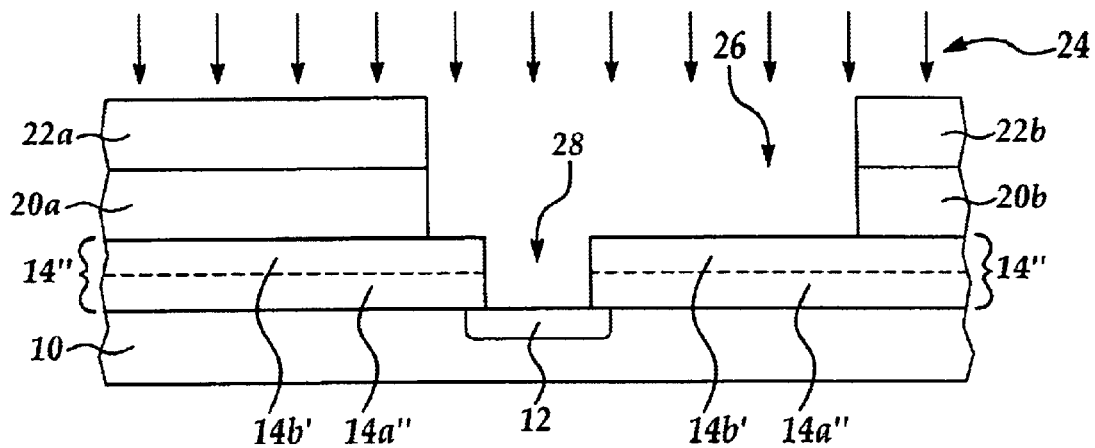

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein: (1) the blanket second dielectric layer 20 has been patterned to form a pair of patterned second dielectric layers 20a and 20b which define a trench 26; and (2) the etched blanket first graded dielectric layer 14' has been further etched to form a pair of patterned first graded dielectric layers 14" which define a via 28 contained areally within the trench 26, and wherein the pair of patterned first graded dielectric layers 14' comprises the pair of patterned first nitrogen rich contiguous sub-layers 14b' formed upon a pair of patterned first nitrogen poor contiguous sub-layers 14a'. The above defined features are formed while employing a second etching plasma 24, to thus form within the microelectronic fabrication whose schematic cross-sectional diagram is illustrated in FIG. 4 a dual damascene structure.

Within the preferred embodiment of the present invention, the second etching plasma 24 employs an etchant gas composition with an enhanced selectivity for the material from which is formed the blanket second dielectric layer 20 and the blanket nitrogen poor contiguous sub-layer 14a of the blanket first graded dielectric layer 14 in comparison with the material from which is formed the blanket first nitrogen rich contiguous sub-layer 14b of the blanket first graded dielectric layer 14. Thus, as is understood by a person skilled in the art, the pair of patterned first nitrogen rich contiguous sub-layers 14b' of the patterned first graded dielectric layers 14" serve as both a pair of etch stop layers and in part as a pair of patterned first dielectric layers within a dual damascene structure in accord with the preferred embodiment of the present invention.

Figure 5:
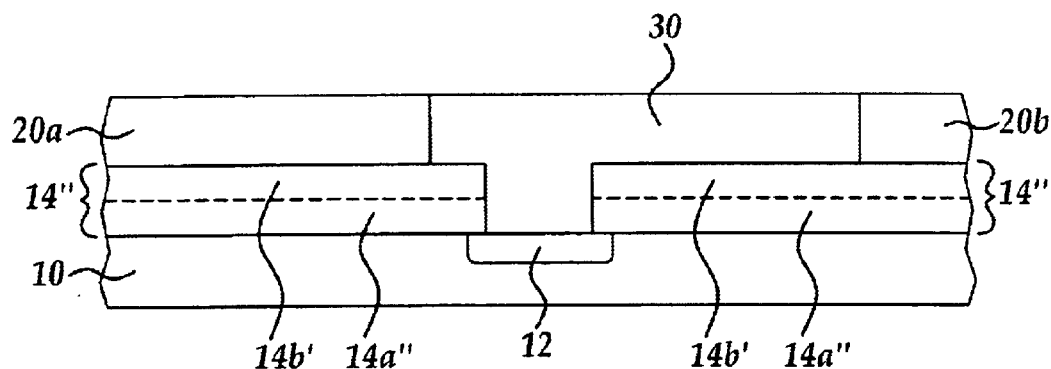

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein, in a first instance, the pair of patterned second photoresist layers 22a and 22b has been stripped from the microelectronic fabrication. The pair of patterned second photoresist layers 22a and 22b may be stripped from the microelectronic fabrication whose schematic cross-sectional diagram is illustrated in FIG. 4 to provide in part the microelectronic fabrication whose schematic cross-sectional diagram is illustrated in FIG. 5 while employing photoresist stripping methods and materials analogous or equivalent to the photoresist stripping methods and materials which are employed for stripping from the microelectronic fabrication whose schematic cross-sectional diagram is illustrated in FIG. 2 the pair of patterned first photoresist layers 16a and 16b to provide in part the microelectronic fabrication whose schematic cross-sectional diagram is illustrated in FIG. 3.

Finally, there is also shown within the schematic cross-sectional diagram of FIG. 5 formed into the trench contiguous with the via as illustrated within the schematic cross-sectional diagram of FIG. 4 a contiguous patterned conductor interconnect and patterned conductor stud layer 30.

The contiguous patterned conductor interconnect and patterned conductor stud layer 30 as illustrated within the schematic cross-sectional diagram of FIG. 5 may be formed employing a dual damascene chemical mechanical polish (CMP) planarizing method as is otherwise conventional in the art of semiconductor integrated circuit microelectronic fabrication to form the contiguous patterned conductor interconnect and patterned conductor stud layer 30 of a conductor material (and typically and preferably also a barrier material) as is conventional in the art. Such conductor materials may include but are not limited to metal, metal alloy, doped polysilicon (resistivity greater than about 0.5 Ohm/cm) and polycide (doped polysilicon/metal silicide) conductor materials, with copper metal conductor materials being particularly preferred. Similarly, such barrier materials may include, but are not limited to titanium nitride, tungsten nitride and tantalum nitride barrier materials, with tantalum nitride barrier materials being particularly preferred.

Upon forming the microelectronic fabrication whose schematic cross-sectional diagram is illustrated in FIG. 5 there is formed a microelectronic fabrication in accord with the preferred embodiment of the present invention. The microelectronic fabrication so formed has formed therein a pair of patterned first graded dielectric layers 14" which serve simultaneously as a pair of etch stop layers and as a pair of patterned first dielectric layers within a dual damascene structure. Lower lying portions of the pair of patterned first graded dielectric layers 14" are formed with a comparatively low dielectric constant, while upper lying surface portions of the pair of patterned first graded dielectric layers 14" are formed with enhanced adhesion as substrate layers.

EXAMPLES

There was provided a series of three semiconductor substrates, and formed over the series of three semiconductor substrates was either one of: (1) a silicon, carbon and nitrogen containing dielectric layer in accord with the preferred embodiment of the present invention; (2) a silicon carbide dielectric layer; or (3) a silicon nitride dielectric layer.

To form the silicon, carbon and nitrogen containing dielectric layer in accord with the present invention, there was employed a plasma enhanced chemical vapor deposition (PECVD) method which employed: (1) a reactor chamber pressure of about 3 torr; (2) a source radio frequency power of about 600 watts; (3) a semiconductor substrate temperature of about 400 degrees centigrade; (4) a trimethylsilane flow rate of about 200 standard cubic centimeters per minute (sccm); (5) an ammonia flow rate of about 100 standard cubic centimeters per minute (sccm); and; (6) a nitrogen flow rate of about 1000 standard cubic centimeters per minute.

To form the silicon carbide layer there was employed an analogous plasma enhanced chemical vapor deposition (PECVD) method employing trimethylsilane with either a helium diluent gas or an argon diluent gas, but without a nitrogen diluent gas or ammonia.

To form the silicon nitride layer there was employed an analogous plasma enhanced chemical vapor deposition (PECVD) method employing silane along with ammonia and nitrogen.

There was then measured for each of the three dielectric layers a dielectric constant, in conjunction with a film stress and a refractive index (both as deposited and after three days in air). Results of the measurements are provided in Table I as follows.

TABLE I

|  | Dielectric Layer | | |
| --- | --- | --- | --- |
|  | Invention | SiC | SiN |
| Dielectric Constant | 5.2 | 5.1 | 7.2 |
| Stress as Deposited | −1.49E9 | −5.8E8 | −1.0E9 |
| Refr Index as Deposited | 1.935 | 2.201 | 2.050 |
| Stress after 3 Days | −1.48E9 | +1.03E9 | −1.0E9 |
| Refr Index after 3 Days | 1.930 | 2.093 | 2.050 |

As is seen from review of the data within Table I, a dielectric layer formed in accord with the present invention exhibits a comparatively low dielectric constant and stable dielectric properties in comparison with alternative silicon carbide and silicon nitride dielectric materials which may also be employed for forming etch stop layers within microelectronic fabrications.

As is understood by a person skilled in the art, the preferred embodiment and examples of the present invention are illustrative of the present invention rather than limiting of the present invention. Revisions and modifications may be made to methods, materials, structures and dimensions through which is fabricated a microelectronic fabrication in accord with the preferred embodiment and examples of the present invention, while still fabricating a microelectronic fabrication in accord with the present invention, further in accord with the accompanying claims.

What is claimed is:

1. A microelectronic device comprising:
   a substrate;
   a dielectric layer formed over the substrate, wherein the dielectric layer is formed from a dielectric material comprising silicon, carbon and nitrogen with a graded concentration of nitrogen within a thickness of said dielectric layer, and wherein the dielectric layer is employed simultaneously as an etch stop layer and a lower dielectric layer within a dual damascene microelectronic structure.

2. The microelectronic device of claim 1 wherein the dielectric material further comprises oxygen.

3. A method for forming a dielectric layer comprising:
   providing a substrate;
   forming over the substrate a dielectric layer, the dielectric layer being formed from a dielectric material comprising silicon, carbon and nitrogen with a graded concentration of nitrogen within a thickness of said dielectric layer, wherein the dielectric layer is employed simultaneously as a etch stop layer and a lower dielectric layer within a dual damascene microelectronic structure.

4. The method of claim 3 wherein the dielectric material further comprises oxygen.

5. The method of claim 3 wherein by grading the nitrogen content within the dielectric layer to provide a higher nitrogen content within an exposed surface layer of the dielectric layer the dielectric layer provides enhanced adhesion to an overlying layer formed upon the dielectric layer.

6. The method of claim 3 wherein the dielectric layer is formed to a thickness of from about 200 to about 1000 angstroms.

7. The method of claim 3 wherein the dielectric layer is formed employing a chemical vapor deposition (CVD) method employing an organosilane silicon and carbon source material and a separate nitrogen source material.

8. The method of claim 7 wherein:
   the organosilane silicon and carbon source material is selected from the group consisting of alkylsilanes, arylsilanes and alkylarylsilanes; and
   the nitrogen source material is selected from the group consisting of nitrogen, ammonia and hydrazine.

* * * * *